US008428894B2

(12) United States Patent
Rocci et al.

(10) Patent No.: US 8,428,894 B2
(45) Date of Patent: Apr. 23, 2013

(54) MEASURING AND MONITORING A POWER SOURCE (71) Applicant: Phoenix Broadband Technologies, LLC, Montgomeryville, PA (US)

(72) Inventors: Joseph D. Rocci, Lansdale, PA (US); Michael L. Quelly, Quakertown, PA (US)

(73) Assignee: Phoenix Broadband Technologies, LLC, Montgomeryville, PA (US)

( * ) Notice: Subject to any disclaimer, the term of this patent is extended or adjusted under 35 U.S.C. 154(b) by 0 days.

(21) Appl. No.: 13/677,417

(22) Filed: Nov. 15, 2012

(65) Prior Publication Data

US 2013/0080095 A1    Mar. 28, 2013

Related U.S. Application Data (60) Division of application No. 13/246,007, filed on Sep. 27, 2011, which is a continuation of application No. 12/104,126, filed on Apr. 16, 2008, now Pat. No. 8,032,316.

(51) Int. Cl.
*G06F 17/5036* (2006.01)
(52) U.S. Cl.
USPC ............................................................ 702/57
(58) Field of Classification Search .................. 702/57
See application file for complete search history.

(56) References Cited

U.S. PATENT DOCUMENTS

| | | | |
|---|---|---|---|
| 4,336,314 A | 6/1982 | Yonezu et al. | |
| 4,885,523 A | 12/1989 | Koenck | |
| 4,965,738 A | 10/1990 | Bauer et al. | |
| 5,119,011 A | 6/1992 | Lambert | |
| 5,606,242 A | 2/1997 | Hull et al. | |
| 5,666,040 A | 9/1997 | Bourbeau | |
| 5,862,515 A | 1/1999 | Kobayashi et al. | |
| 5,936,385 A | 8/1999 | Patillon et al. | |
| 6,005,367 A | 12/1999 | Rohde | |
| 6,081,095 A | 6/2000 | Tamura et al. | |
| 6,137,267 A | 10/2000 | Kates et al. | |
| 6,198,253 B1 | 3/2001 | Kurle et al. | |
| 6,239,579 B1 | 5/2001 | Dunn et al. | |
| 6,271,643 B1 | 8/2001 | Becker et al. | |
| 6,307,349 B1 | 10/2001 | Koenck et al. | |
| 6,504,344 B1 | 1/2003 | Adams et al. | |
| 6,936,995 B2 | 8/2005 | Kapsokavathis et al. | |
| 6,983,212 B2 | 1/2006 | Burns | |
| 7,166,384 B2 | 1/2007 | LaFollette et al. | |
| 7,173,397 B2 | 2/2007 | Kinoshita et al. | |
| 7,557,539 B2 * | 7/2009 | Takagi et al. | 320/122 |

(Continued)

*Primary Examiner* — Aditya Bhat
(74) *Attorney, Agent, or Firm* — Woodcock Washburn LLP (57) ABSTRACT

Battery testing sensors, and systems and methods for testing batteries, are disclosed. Each battery sensor has a microcontroller programmed to analyze the frequencies of noise or other undesirable signals ("background noise") present at a battery to be tested, and to determine the duty cycle of a desired pulse width modulation (PWM) signal to be applied to the battery in view of the background noise. Duty cycles of desired PWM signals are selected such that, when applied to the battery, they will at least approximate an AC signal having a frequency that has been determined to provide optimal test results in view of the background noise. The microcontroller analyzes the battery's response from application of the PWM signal thereto. Consequently, measurement errors from background noise present at the battery are minimized. Based on the response, attributes of the battery, such as internal admittance, voltage, current, and temperature, are determined.

24 Claims, 9 Drawing Sheets

U.S. PATENT DOCUMENTS

| | | |
|---|---|---|
| 7,710,119 B2 | 5/2010 | Bertness |
| 7,970,560 B2 | 6/2011 | Rocci et al. |
| 8,032,316 B2 | 10/2011 | Rocci et al. |
| 8,044,815 B2 | 10/2011 | Du et al. |
| 2006/0152190 A1 | 7/2006 | Riemschneider |
| 2008/0197808 A1 | 8/2008 | Banta et al. |
| 2008/0252257 A1 | 10/2008 | Sufrin-Disler et al. |
| 2008/0258683 A1 | 10/2008 | Chang |
| 2011/0068746 A1 | 3/2011 | Rocci et al. |
| 2011/0288798 A1 | 11/2011 | Rocci et al. |

* cited by examiner

MEASURING AND MONITORING A POWER SOURCE

CROSS-REFERENCE TO RELATED APPLICATION

This application is a divisional of U.S. patent application Ser. No. 13/246,007, filed Sep. 27, 2011, which is a continuation of U.S. patent application Ser. No. 12/104,126, filed Apr. 16, 2008, the disclosures of which are hereby incorporated by reference as if set forth in its entirety herein.

BACKGROUND

Many industries and applications use storage batteries. Power utilities, transportation companies, alternative energy companies, data centers, banks, office complexes, etc. use storage batteries to backup a primary power source. For example, communications and computing equipment in telecommunication central offices, datacenters, and wireless network cell sites use a direct current (DC) power source, typically −48V or −24V. Typically, the commercial alternating current (AC) power feed that supplies a site is converted to DC to appropriately match the requirements of the individual equipment.

Because commercial AC power is not always reliable enough for mission critical systems, it is common to provide backup power in the event of a failure of the commercial feed. The backup power is typically provided by a collection of power sources or electrochemical batteries, known as a battery plant. The batteries may be located within the site and coupled with power distribution bars, to feed DC equipment, and with inverters, to feed AC equipment. The batteries may be located within an uninterruptible power supply (UPS). Regardless of where the batteries are located, they are often oriented in groups, wired in series up to a required voltage.

In order to obtain the maximum battery run-time and life expectancy, it is necessary to perform periodic maintenance tests. These tests are commonly performed by maintenance personnel who travel to the remote site. Using complex and expensive equipment, the personnel take measurements and readings from the batteries. This work is made more difficult when the batteries are located in areas with electromagnetic noise, such as that emitted by the equipment being powered. In order to increase battery plant reliability and lower maintenance costs, it is desirable to perform these tests in a manner that minimizes measurement errors and perhaps without the need to physically dispatch maintenance personnel.

SUMMARY

The disclosed battery monitoring systems and methods may be used to remotely measure the condition of one or more batteries. The systems and methods may minimize measurement errors due to noise and/or other disruptions, such as noise caused by related equipment.

One or more battery monitoring sensors may be mechanically and electrically attached to the terminal posts of the monitored batteries. Each respective battery sensor may measure attributes of a respective battery. The attributes may include internal admittance, voltage, current, temperature, etc. The attributes may be used to determine internal battery characteristics. The internal battery characteristics may be correlated with battery performance and/or overall battery condition.

The sensors may each generate a pulse width modulated signal that when applied to the battery form an AC test signal having a defined waveform, frequency, amplitude, and/or duration. The sensor may measure the battery's response to the test signal. The resultant response signal may be measured to determine the health of the battery, including its internal admittance.

The sensor may determine an optimum frequency to test the battery. The sensor may scan a frequency range and measure the amount of noise present. The sensor may select a frequency with little noise for testing the battery.

By testing the battery, it may be determined that the battery is overcharged. The state of charge of individual batteries within a string of similar batteries may be equalized by varying the duration and regularity of the battery test process, drawing current to effectively protecting the batteries from overcharging.

A site control unit may be electrically attached to the battery sensors by way of interconnection cables. The site controller may poll one or more of the battery sensors periodically. The poll may collect measurement data from the sensors and/or send control commands to the sensors. The site controller may include an network interface. The network interface may enable connection to a general purpose data network. The site controller may interface with software/server systems, via the data network. The software/server systems may use the sensor information as part of an overall battery population monitoring and management program.

The disclosed measurement systems and methods provide a range of measurement types, able to adapt the measurement device to a wide range of battery types. The disclosed system provides improved accuracy in a simplified and reproducible digital implementation.

DETAILED DESCRIPTION OF ILLUSTRATIVE EMBODIMENTS

Figure 1:
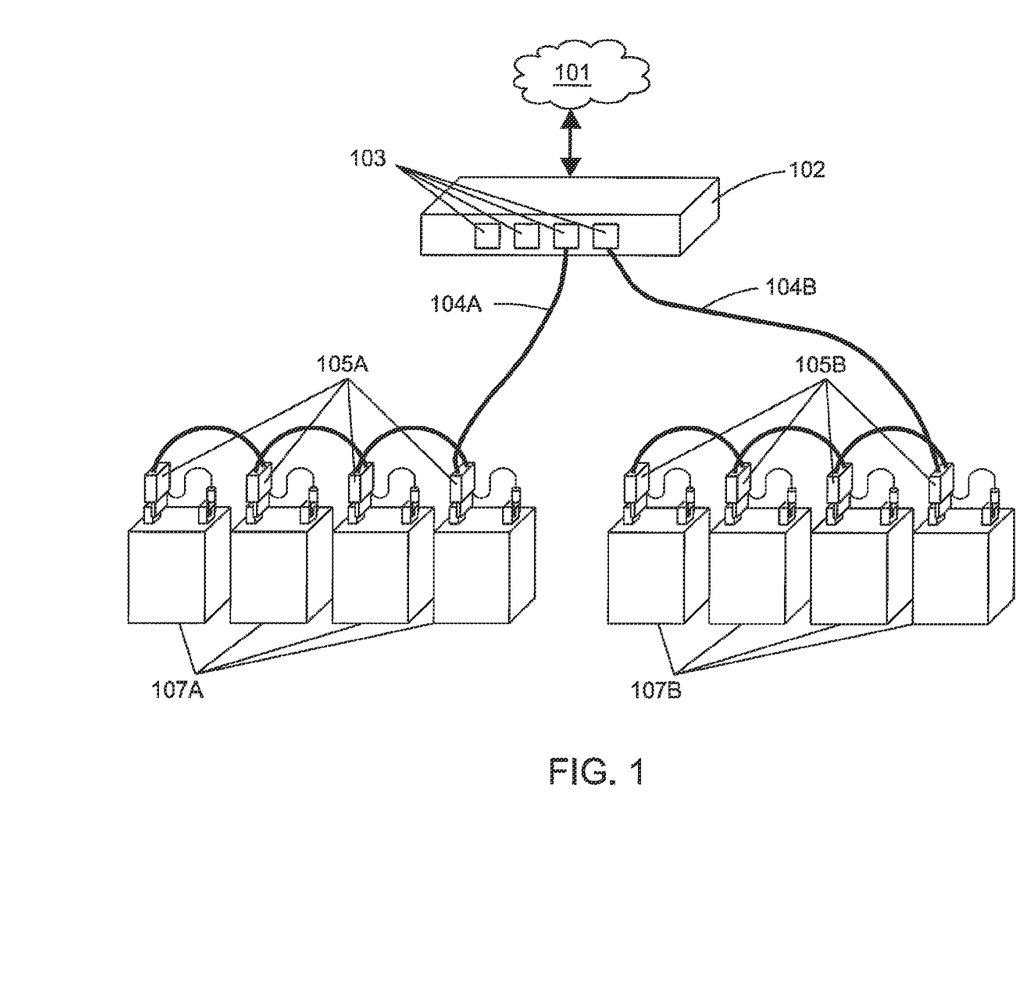
FIG. 1 depicts an example battery monitoring system.

FIG. 1 depicts a battery monitoring system. One or more battery monitoring sensors 105A-B may be mechanically and electrically attached to the terminal posts of the monitored batteries 107A-B. Each respective battery sensor 105A-B may measure attributes of a respective battery 107A-B. The attributes may include the internal admittance (i.e., the inverse of impedance), the voltage, the current, the temperature, etc.

A site control unit 102 may be electrically attached to the battery sensors 105A-B by way of interconnection cables 102A-B. The site control unit 102 may be connected to the battery sensors 105A-B via a wireless channel including radio frequency (RF), optical, magnetic field induction, or the like. The site control unit 102 may poll one or more of the battery sensors 105A-B periodically. The poll may collect measurement data from the sensors 105A-B and/or send control commands to the sensors 105A-B. The site control unit 102 may include a network interface. The network interface may enable connection to a general purpose data network 101. The data network 101 may be an Internet Protocol (IP) network, or it may use another network protocol. The data network may employ T1, ISDN, DSL, broadband, Ethernet, WiFi, or other transport suitable for data transfer. The site control unit 102 may interface with software systems, via the data network 101. The software systems may use the sensor information as part of an overall battery population monitoring and management program. With this system, any number of batteries 107A-B may be monitored.

As shown, two strings of batteries 107A-B may be monitored by an exemplary remote battery monitoring system. Batteries 107A may be connected in series to form a first battery string. Likewise, batteries 107B may connected in series to form a second battery string. Each battery 107A-B in each string may be connected to a sensor unit 105A-B. Each sensor unit within the first string 107A may be interconnected via a communications cable 104A. Likewise, each sensor unit within the second string 107B may be interconnected via a communications cables 104B. Communications cables 104A-B may be four-conductor telephone cables or any other cable suitable for data transmission. Communication cables 104A-B enable data communication between the sensor units 105A-B and a site control unit 102. This communication may be serial and/or parallel data communication. Strings of sensor units 105A-B may be connected to the site control unit 102. The site control unit 102 may include a number of interfaces 103 to support many communication cables 104A-B and, in turn, many batteries 107A-B under test. The site control unit 102 may be connected to a data network 101.

Each sensor unit 105A-B may test its respective battery 107A-B and may communicate data indicative of the battery's condition (e.g., admittance, temperature, voltage, etc.) to the site control unit 102. The site control unit 102 subsequently performs mathematical calculations on the received data to report metrics indicative of battery condition. The site control unit may report the battery metrics via the data network 101. It may provide a regular report via File Transfer Protocol (FTP), Hypertext Transport Protocol (HTTP), and/or another protocol. It may provide the metrics as requested or polled by a user or management system via Simple Network Management Protocol (SNMP) and/or another protocol. The site control unit 102 may include a web server to display battery metrics and to receive management controls.

Each sensor unit 105A-B within a string may determine the total voltage of the respective string of batteries 107A-B. The site controller 102 may measure this voltage with respect to the string of batteries' overall minus voltage. The result is an overall voltage of the string. The site controller 102 may report this voltage to all sensors 105A-B within the string via a broadcast message over the communication cable 104A-B.

Each sensor 105A-B may determine its relative position within the respective string of batteries 107A-B. Once each sensor unit 105A-B determines its relative position within the string, it may assume a logical address for purposes of communications with the site controller 102. Thus, the system may identify an individual battery from the population of batteries under test.

Figure 2:
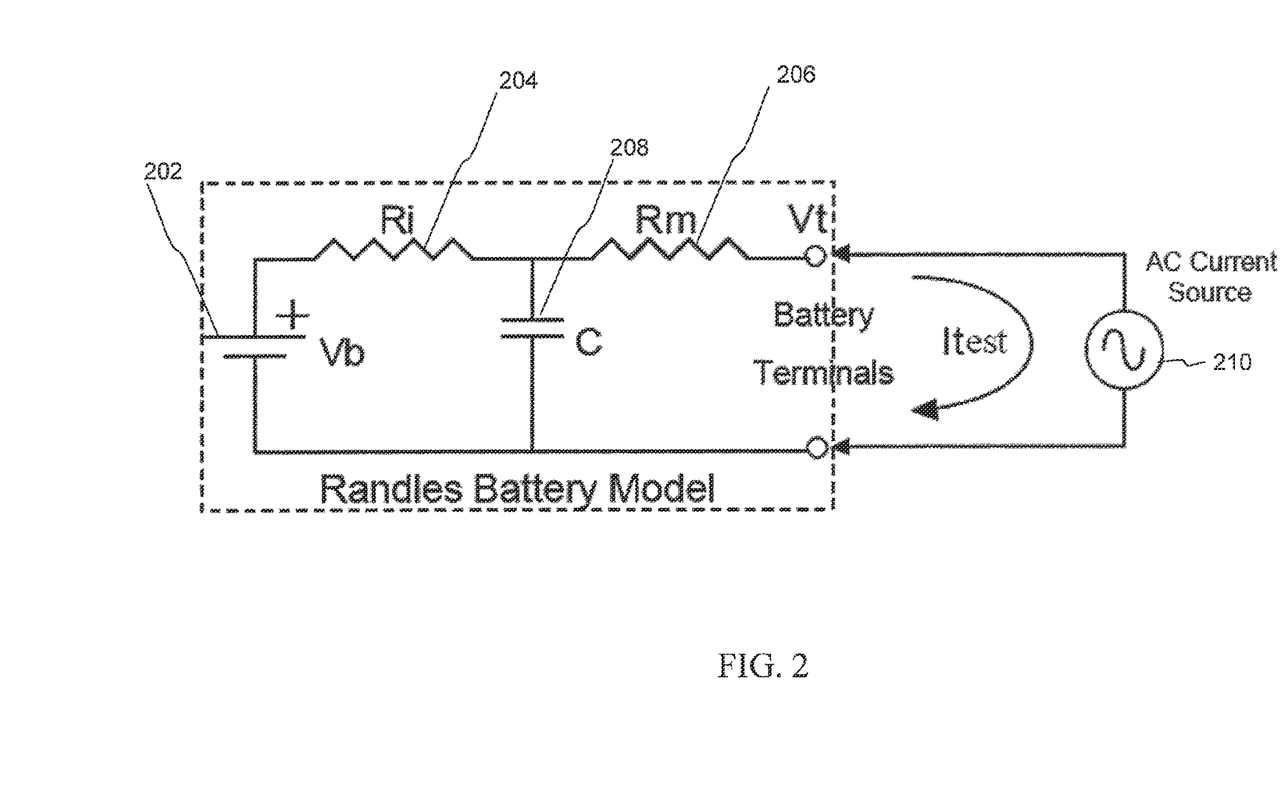
FIG. 2 depicts an example circuit diagram of battery model test circuit.

FIG. 2 depicts a circuit diagram of a battery model test circuit. A simplified model of an electrochemical battery may include an ideal voltage source (Vb 202), two significant resistance elements (Ri 204 and Rm 206), and a capacitive element (C 208) arranged as shown in FIG. 2. Other arrangements of Ri 204, Rm 206, and C 208 may be used. The model as shown is commonly called the "Randles Battery Model."

In this model, the ideal voltage source may be represented as "Vb" 202. An equivalent internal resistance attributable to the Vb source 202 may be represented as "Ri" 204. The resistance due to metallic connections may be represented as "Rm" 206. The equivalent internal capacitance may be represented as "C" 208.

For example, in practical applications of lead-acid batteries with capacities of 100-200 ampere-hours, Ri 20 and Rm 206 combined may be valued at between about 1.0 milliohm to about 10 milliohm. Rm 206 may be approximately 45% of the total internal resistance. Ri 204 may be attributed to current generating limitations of the electrochemical process. Ri 204 may be approximately 55% of total internal resistance. C 208 may be valued at about 1.5 Farads per 100 ampere-hours of capacity. Rm 206 may be attributed to the internal metallic connections.

Applying an AC current from an AC current source 210 of known frequency and amplitude and observing the resultant AC voltage developed at the battery terminals may enable a determination of values of the parameters of the circuit model. A sinusoidal AC test current (Itest) of known frequency and amplitude may be applied to the battery terminals. The AC component of the voltage developed across the battery terminals (Vt) may be a frequency dependent function. The AC component of the voltage developed across the battery terminals (Vt) may relate to the values of Ri 204, Rm 206, C 208, the amplitude of the AC test current (Itest), and the frequency of the AC test current (Itest).

For example, at low frequencies, approaching DC, the AC component of Vt may reach a maximum value determined by the combined resistance of Ri 204 and Rm 206 (Rb=Ri+Rm). At high frequencies, approaching infinity, the low reactance of capacitor C 208 may form an effective short-circuit such that Vt is primarily determined by Rm 206. Thus, the values of Ri 204, Rm 206, and C 208 may be characterized by varying the frequency of the test signal while observing the magnitude of the AC component of Vt.

To illustrate, in a typical lead-acid battery, this process may be simplified by use of the following approximations:

C=1.5 F per 100 amp-hours of battery capacity
1/(Rb)=150 mho per 100 amp-hours of battery capacity
Ri=1.25*Rm These approximations generally scale linearly with amp-hour capacity. These constants may be stored in memory and used to calculate the internal battery characteristics. This linear scaling may provide an acceptable first-order approximation of a lead-acid battery's performance when subjected to the AC test current as described above. The Randles circuit equivalent, shown in FIG. 2, may be modeled with a software circuit analysis tool, SPICE for example. In the modeling, the frequency response of Vt may be shown to be relatively flat at frequencies below about 25 Hz and to reduce by about 50% as the test frequency is increased to 60 Hz. Thus, an example test frequency may include up to the 20 Hz range. Since Ri 204, Rm 206, and C 208 vary fairly linearly with a battery's amp-hour capacity, this generalized approach is useful for a wide range of battery sizes.

Figure 3:
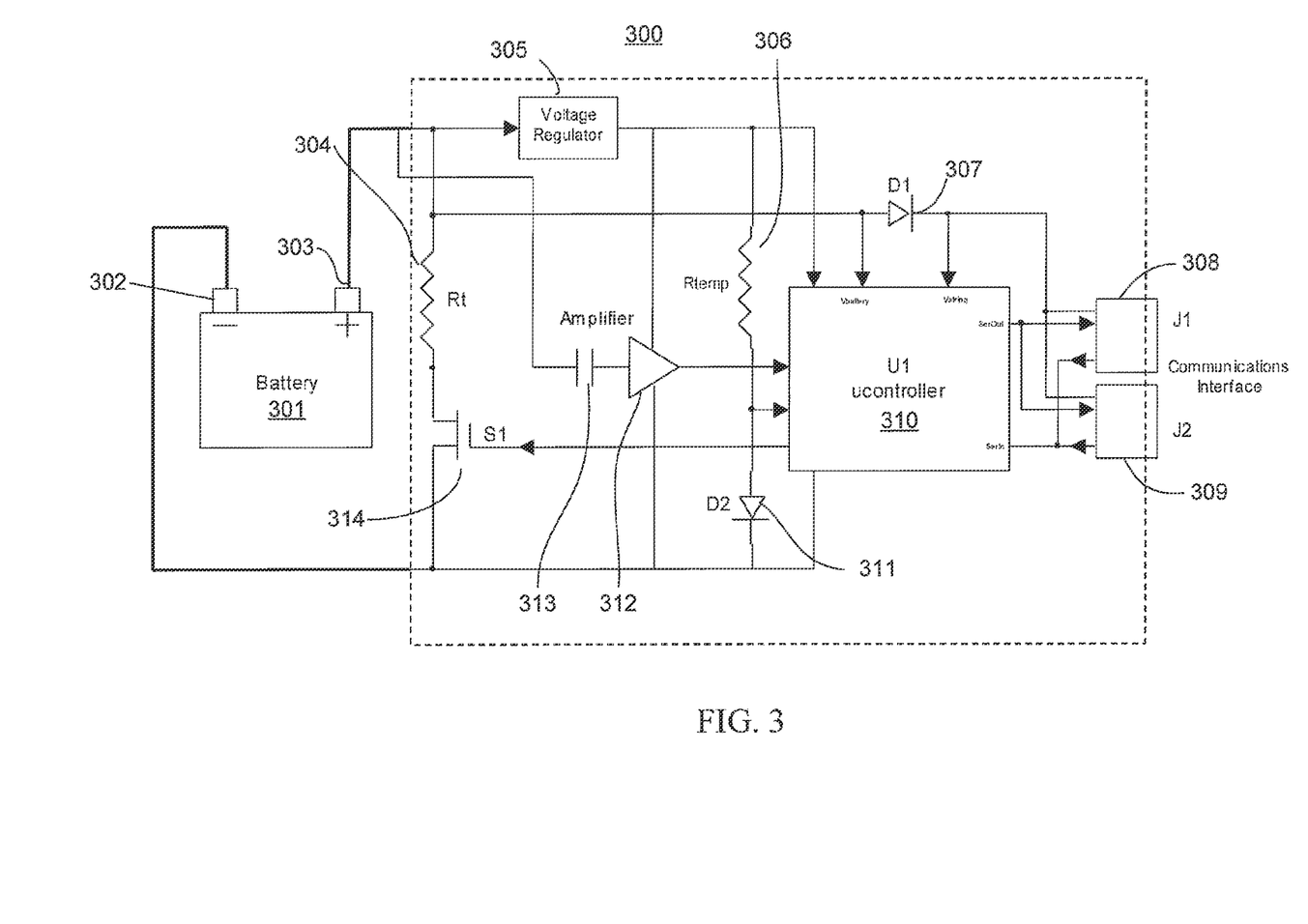
FIG. 3 depicts an example circuit diagram of an example battery sensor.

FIG. 3 depicts a circuit diagram of an example battery sensor 300. The sensor 300 is merely one embodiment; other circuits that measure similar parameters are contemplated. The sensor 300 may generate a low-frequency sinusoidal test signal by using high frequency pulse-width modulated rectangular signals to excite the battery under test. This method may achieve a low frequency sinusoidal test signal excitation using high-frequency rectangular signals.

The sensor 300 may be connected to a battery 301 under test. The positive terminal 303 of the battery 301 may be connected to a first node of a resistive load 304 with a resistance value of Rt. The second node of the resistive load 304 may be connected to one contact of a switch 314. The second contact of the switch 314 may be connected to the negative terminal 302 of the battery 301. The switch 314 may be a single pole single throw switch and may open and close current flow from the battery 301 across the resistive load 304. The switch 314 may be controllable, such as a FET switch implementation, for example.

One node of a capacitor 313 may be connected to the positive terminal of the battery 301. The other node of the capacitor 313 may be connected to the input of a voltage amplifier 312. The voltage amplifier 312, may amplify changes in voltage Vt measured at the positive terminal 303 of the battery 301 with respect to the negative terminal 302 of the battery 301.

The output of the voltage amplifier 312 may be input to a microcontroller 310. The microcontroller 310 may be a single-chip microcontroller, for example. The microcontroller 310 may include a built-in analog-to-digital converter. The microcontroller 310 may include a dual-port optically isolated serial communications interface with a first port 308 and a second port 309.

In an embodiment, the sensor 300 may include a diode 307. The anode side of diode 307 may be connected both to the microcontroller 310 and the positive terminal 304 of the battery 301. The cathode side of the diode 307 may be connected both to the microcontroller 310 and the first 308 and second 309 communications interface ports. The diode 307 in this arrangement may provide a summing function, such that when the sensor 400 is placed in a string with other like sensors, the sensor 300 may determine its position within the string.

In an embodiment, the sensor 300 may include a resistor 306 in connection with a diode 311 to measure temperature. A first node of the resistor 306 may be connected to a voltage regulator 305. A second node of the resistor 306 may be connected to both the microcontroller 310 and the anode side of the diode 311. The cathode side of the diode 311 may be connected to the negative terminal of battery 301. In this arrangement, the DC voltage across the diode 311 at the microcontroller may be proportional to the battery's temperature. Other temperature sensors, such as an electrical resistance thermometer, an infrared thermometer, a silicon bandgap temperature sensor, a thermistor, a thermocouple, a coulomb blockade thermometer, etc. may be used as well.

The voltage regulator 305 may provide DC power to the remote measurement sensor 300. One node of the voltage regulator 305 may be connected to the positive terminal 303 of the battery 301. The other node of the voltage regulator 305 may be connected to the temperature sensor 306, the voltage amplifier 312 and the microcontroller 310. The voltage amplifier 312 and the microcontroller 310 may also be connected to the negative terminal 302 of the battery 301.

The output voltage of the amplifier 312, the voltage of the temperature sensor 306, and the voltages at both sides of the summing diode 307 may be input to the analog-digital converter in the microcontroller 310. Each voltage may be measured, quantified, and used in the mathematical and logical processes of characterizing the battery 301.

The microcontroller 310 may be programmed to activate the switch 314. For example, the microcontroller 310 may cause a current (Itest) to flow in the battery when the switch FET gate is driven high. The current Itest may be determined by the battery voltage (Vb) and the value of Rt according to the formula Itest=Vb/Rt.

Figure 4A:
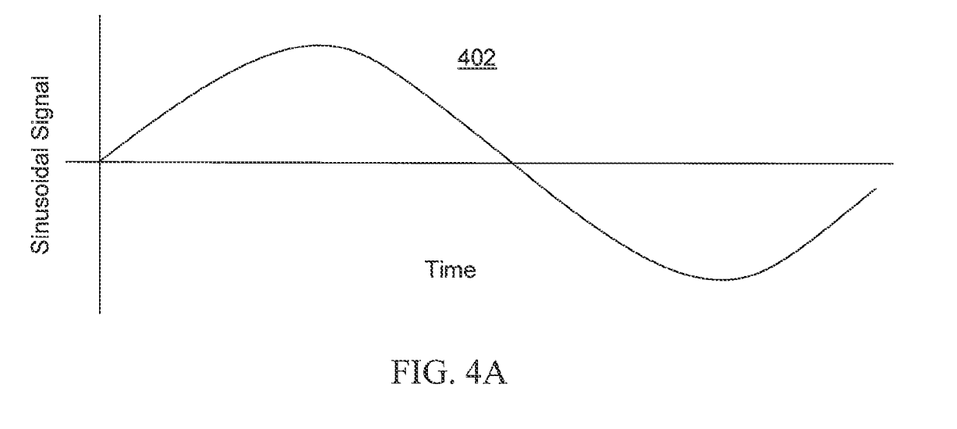
FIGS. 4A & 4B depict an example sinusoidal signal and a corresponding pulse width modulated signal, respectively.
Figure 4B:
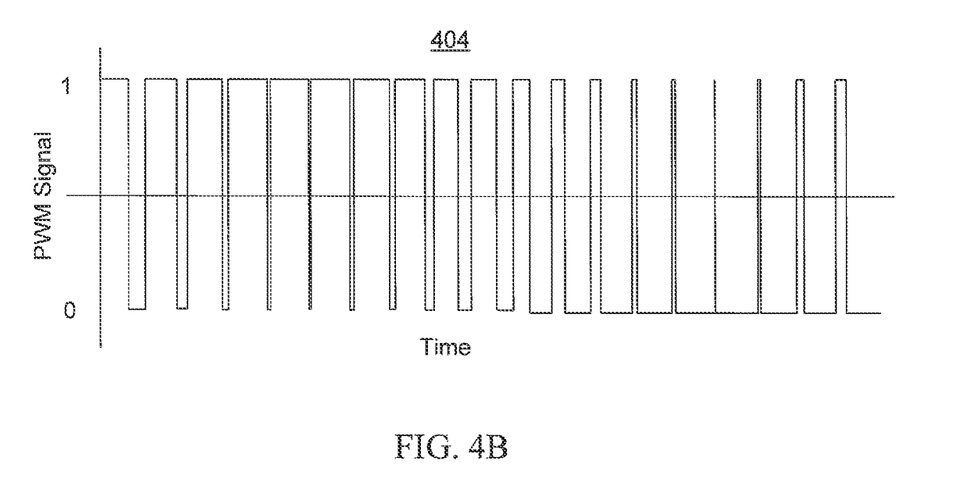

FIGS. 4A & 4B depict an example sinusoidal signal 402 and a corresponding pulse width modulated signal 404, respectively. The microcontroller may have a stepwise approximation of a sinusoid signal 402 stored as a lookup table in its nonvolatile memory. For example, the stepwise approximation may include 256 points. More or fewer points in the lookup table can be used with varying resolution.

The microcontroller may generate a pulse width modulated signal 404 that corresponds to the sinusoidal signal. The microcontroller may include software or hardware to implement a pulse width modulator (PWM). The PWM may step through the values in the sinusoid lookup table. The microcontroller may activate the FET switch for a time proportional to each table value.

The switch may be activated (or closed) for a time (Ton) and then deactivated (or opened) for a time (Toff) such that the duty cycle of the test signal varies in accordance with the stepwise approximation. The duration of Ton and/or Toff may be determined by the sinusoid values from the look up table. Each on-off cycle (i.e., Ton+Toff) may have a constant time period (Tperiod). The value Tperiod may be determined according to the desired low frequency test sinusoid frequency (Ft) and the number of points (Np) in the sinusoid lookup table. For example, Tperiod may be equal to the result of 1/(Ft*Np).

Figure 5:
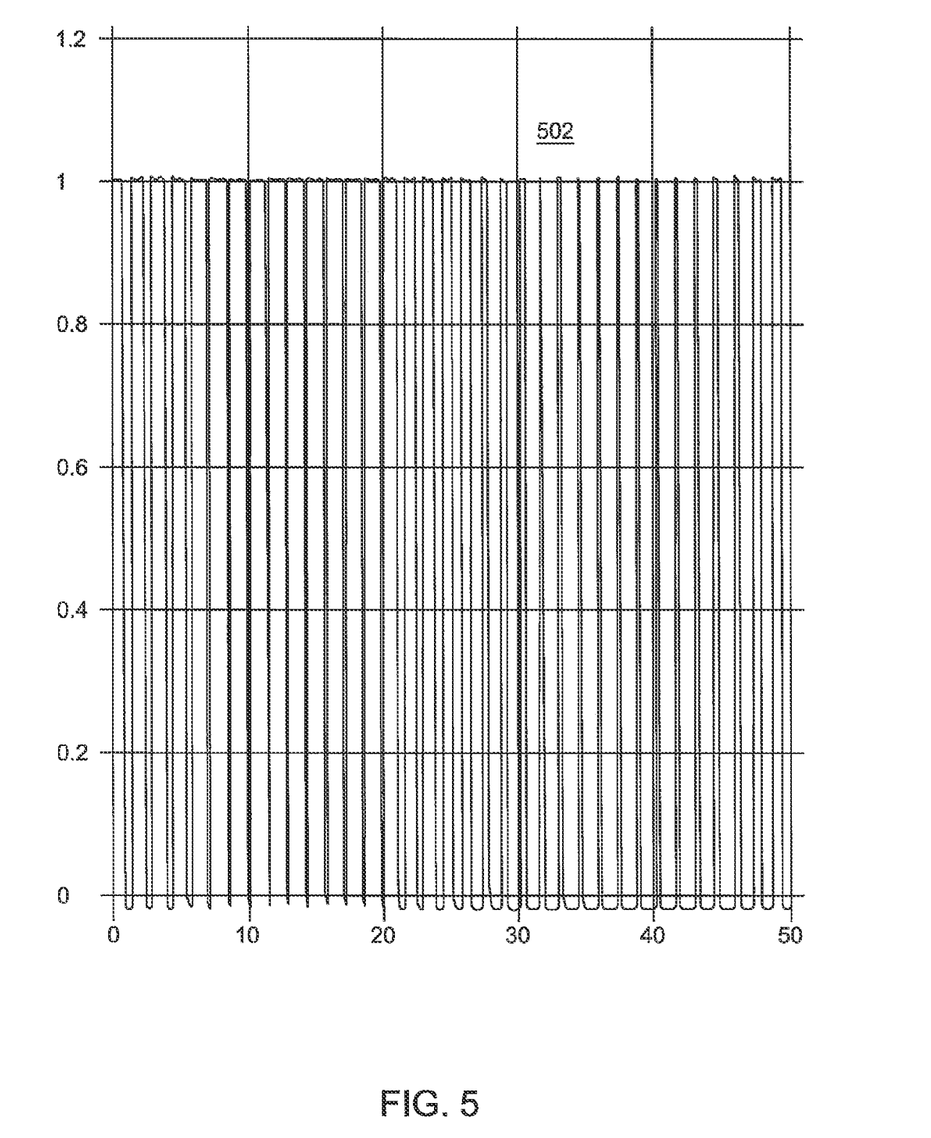
FIG. 5 depicts a signal trace of an example pulse width modulated test signal.

FIG. 5 depicts a signal trace of an example pulse width modulated test signal 502. The microcontroller may generate the pulse width modulated test signal 502. The pulse width modulated test signal 502 may have a rectangular "carrier" frequency. The pulse width modulated test signal 502 may be pulse-width modulated with a lower frequency sinusoidal signal. This example pulse width modulated test signal 502 may drive the switching element Si 314, as shown in the circuit in FIG. 3, thus applying the test signal 502 to the battery under test.

To illustrate, where Ft=20 Hz and Np=256, Tperiod=1/(Ft*Np)=195 usec, or 5128 Hz. A 5128 Hz sinusoidally pulse width modulated rectangular signal, if integrated, may yield a 20 Hz sinusoid. In this illustration, the battery under test may be excited by a rectangular signal with a peak value equal to Itest. Because the instantaneous duty-cycle of this rectangular pulse-train may be modulated by a 20 Hz sinusoid, the average current of the test signal, if integrated, may vary at a 20 Hz rate. The RC time constant of the battery itself may perform the first part of this signal integration, and the circuitry and software within the sensor may provide additional integration.

In an embodiment, the microcontroller can vary the frequency of the test signal 502 by implementing a phase-increment algorithm. In this process, a frequency variable is added to the lookup table location pointer such that every second, third, or nth table location is accessed. The frequency variable defines the number of lookup table positions between each sample being output to the PWM. As the frequency variable is increased, the frequency of the generated signal 502 may increase.

In an embodiment, the current of the integrated sinusoidal frequency test signal may be adjusted by consistently scaling the values in the lookup table before they are passed to the PWM. For example, if each table value is halved before being output to the PWM, then the average current in the integrated sinusoidal frequency test signal will also be halved, even though the higher frequency peak rectangular current is fixed. Finally, the values in the microcontroller's PWM lookup table can be altered, if desired, in order to generate any desired waveform including sinusoid, triangle, sawtooth, rectangular, or virtually any other test signal which may be advantageous.

Figure 6:
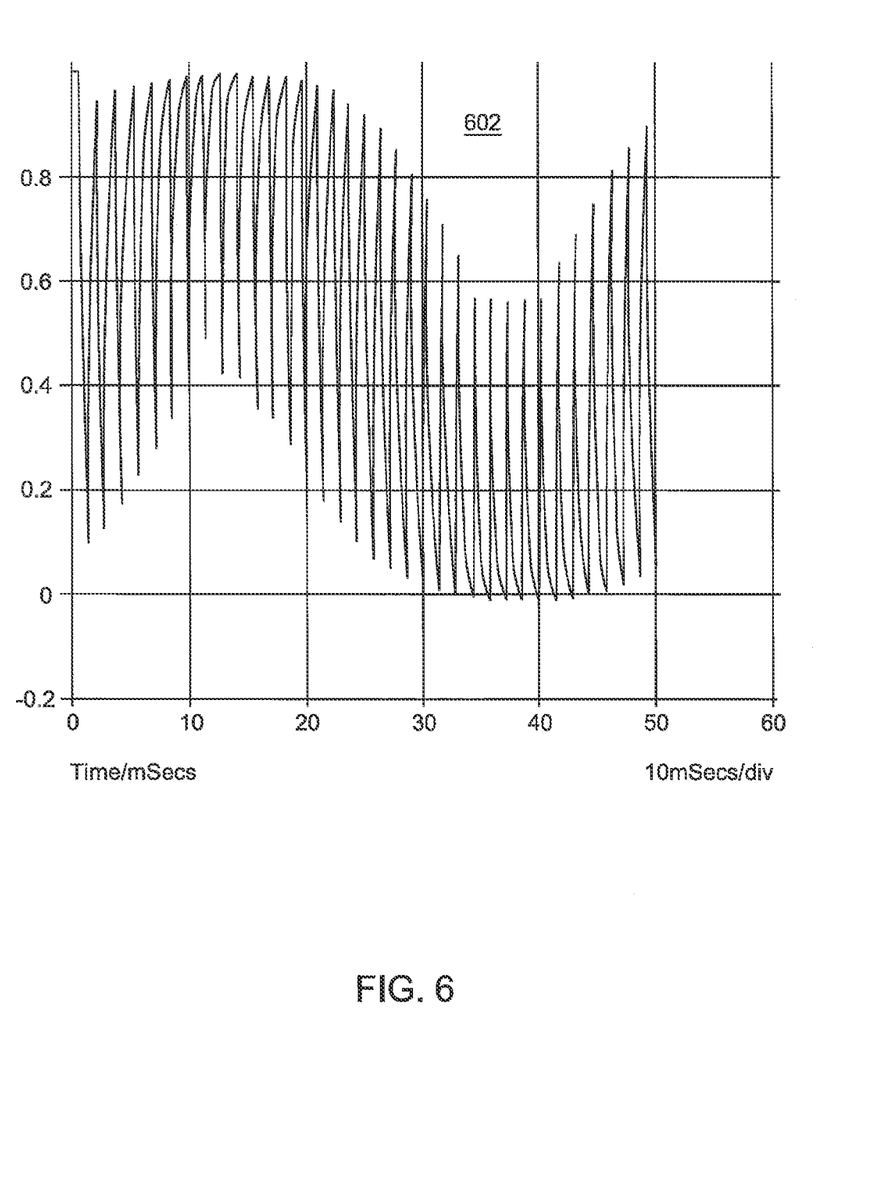
FIG. 6 depicts an example excitation signal, as measured from a battery under test.

FIG. 6 depicts an example excitation signal 602, as measured from a battery under test. The sensor may measure the excitation signal 602, which results from the pulse width modulated test signal having been impressed on the battery. The excitation signal 602 illustrates the AC voltage that develops across the battery terminals as a result of the pulse-width modulated rectangular excitation current shown in FIG. 5. At this point, the excitation signal 602 has been partially filtered due to the RC characteristics of the battery. The battery, owing to its behavior as an RC equivalent circuit, provides a preliminary low-pass filtering function which attenuates some of the high frequency switching carrier and begins to reveal the desired low frequency sinusoidal frequency component.

Figure 7:
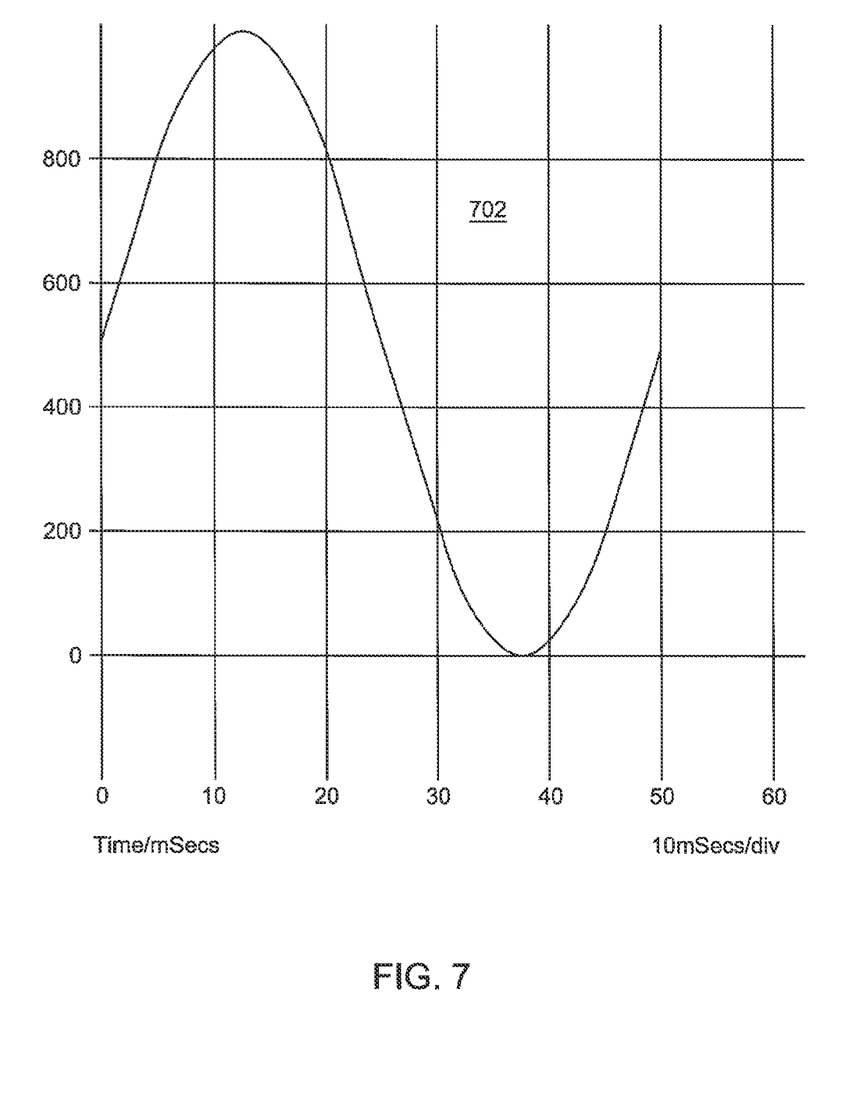
FIG. 7 depicts an example filtered excitation signal.

FIG. 7 depicts an example filtered excitation signal 702. The filtered excitation signal 702 illustrates the result of fully filtering the voltage that developed across battery. The filtered excitation signal 702 may be measured by the microcontroller.

Further filtering inside the sensor may eliminate or significantly reduce the residual high frequency switching component, leaving the low frequency sinusoidal modulation component as the primary signal to be measured. For example, the sensor may include a high-gain amplifier that is AC coupled (e.g., capacitive coupled) to the battery under test. The output of the high gain amplifier may be fed into the analog-to-digital converter in the microcontroller for measurement.

The gain of the amplifier may be controlled by the microcontroller so that a wide range of battery types with differing internal resistances can be measured. For example, the amplifier gain may be in the range of about 200 to about 1000. Also for example, the total internal resistance $Ri=(Ri+Rm)$ of the battery under test may be equal to 0.005 ohm. The integrated component of the low frequency test signal may be equal to 1 ampere peak-to-peak. Then, the AC component of Vt may be $Vt=Itest*Rb=1.0\ A*0.005\ ohm=5\ mV$ peak to peak. This signal may be amplified by a factor of 200, and the result may be a 1.0 volt peak-to-peak signal that is fed to the analog-to-digital converter in the microcontroller for measurement.

Figure 8:
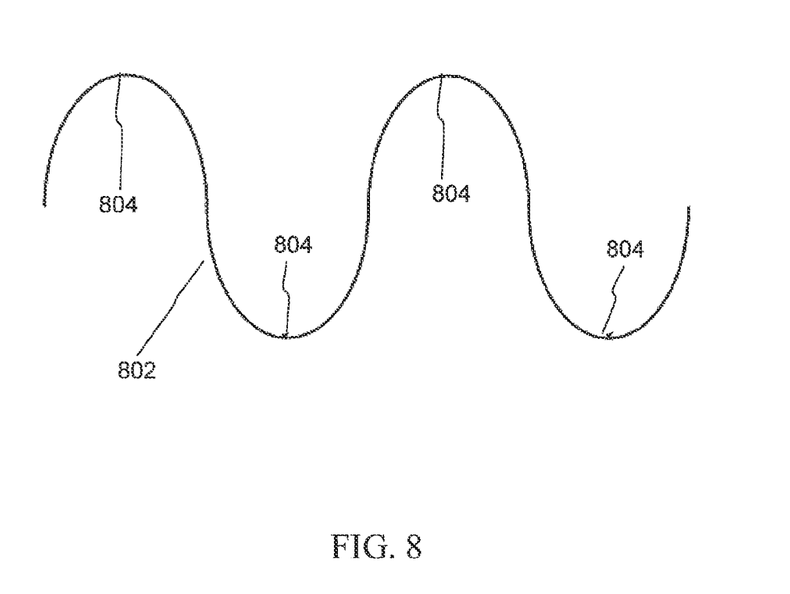
FIG. 8 depicts an example timing diagram for sampling.

FIG. 8 depicts an example timing diagram for sampling. Because the microcontroller may generate the pulse width modulated signal point-by-point, the resultant filtered excitation signal also may be measured point-by-point. The sensor may sample the waveform 802 at defined sample points 804. The sample points 804 may correspond to the signal peaks and valleys. (i.e., the alternating maximums and minimums of the filtered response signal from the battery under test.)

The microcontroller can determine when to sample the recovered signal at the signal peaks and valleys. Each signal peak may be a local maximum. Each signal valley may be a local minimum. Via a correlating synchronous sampling detection process the microcontroller can measure the resultant waveform. Such a process may have a bandpass amplitude response that can discriminate against unwanted signals at frequencies that differ from the sampling rate. The bandwidth of this bandpass response decreases as the number of averaged samples is increased.

For example, as the microcontroller generates each point in the digitally synthesized excitation current sinusoid, it measures at the peaks of the resultant voltage sinusoid. The microcontroller may make multiple measurements at the sinusoidal signal peaks repetitively and may perform an arithmetic average of the measurements.

Since the microcontroller is generating the pulse width modulated test signal while simultaneously measuring the batteries response, the microcontroller may determine when the peaks of the amplified signal will occur and measure the precise peak-to-peak value of the amplified Vt signal. The microcontroller may measure the response signal in accordance with a signal value that produces a peak. The microcontroller may be programmed to measure a plurality (e.g., 256) positive and negative signal peaks. The microcontroller may perform a mathematical average of the measured values.

Although FIGS. 4A-8 show waveforms with differing scale factors, it should be appreciated that scale factors may be set appropriate for the type of battery being measured. For example, the rectangular excitation waveform, as shown in FIG. 5, may switch between zero amps and a peak excitation current appropriate for the type of battery being measured. In typical applications, this peak current may range from about 1-2 amps, and the frequency of the modulating sinusoid may range from 10-30 Hz. The peak-to-peak value of the unfiltered (e.g., as shown in FIG. 6) and fully filtered waveform (e.g., as shown in FIG. 7) may be a function of the peak excitation current and the internal impedance (Z) of the battery. The value of this voltage will typically follow Ohm's Law: $Vbat=Ipeak\times Zbat$. The admittance of the battery may be calculated as the inverse of the impedance (i.e., Zbat).

Figure 9:
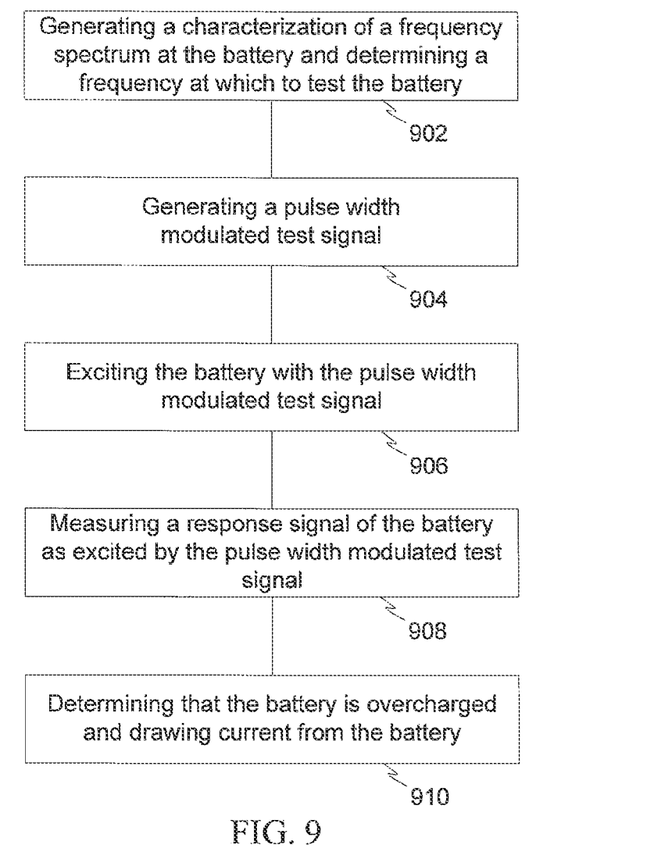
FIG. 9 depicts an example flow chart for testing an internal characteristic of a battery.

FIG. 9 depicts an example flow chart for testing an internal characteristic of a battery. At 902, the sensor may generate a characterization of a frequency spectrum at the battery. The sensor may determine a frequency at which to test the battery. Generally, in battery power-plant systems, the battery charging sub-system, the load subsystem, and various other influences often produce noise and other disturbances that generate interference. The sensor may characterize the signal spectrum around the frequency where a battery test is proposed to be made in order to determine if background noise and interference levels are sufficiently low to make an accurate measurement. The sensor may make frequency agile, frequency selective measurements of AC signals.

The disclosed correlating detection process may be used by the sensor in order to scan a range of frequencies around a proposed measurement frequency. For example, the sensor may operate in a receive-only mode, altering the detection sampling frequency in a stepwise manner, making a signal measurement at each sampling frequency. If the frequency selective detection process is run without generating a corresponding test signal, the detection process may measure the level of signals at the sampling frequency. If this receive-only measurement process is repeated for multiple frequencies within some spectral range, then a spectrum-analysis data set is available. This spectrum analysis data set can be analyzed to determine a frequency or for measurements that reduces the effect of interfering signals.

After a range of frequencies are scanned and characterized in this manner, the sensor may choose a frequency at which the measured background noise is at a minimum and/or sufficiently low to make the measurement. The sensor may then proceed to operate the FET current switch to generate the test signal and make the battery test measurements. In an embodiment, the sensor may report the receive-only frequency point measurements to the control unit so that the result can be displayed as a spectrum analysis display. The sensor may report the battery test results and battery test data to the control unit.

At 904, sensor may generate a pulse width modulated test signal. The duty cycle of the pulse width modulated test signal may vary in accordance with a plurality of alternating current signal data values. For example, the plurality of alternating current signal data values may be stored in memory as a stepwise approximation of a sinusoidal waveform. The frequency of the sinusoidal waveform may be selected based on the results at 902.

At 906, the battery may be excited with the pulse width modulated test signal. For example, the sensor may apply the test signal to the terminals of a battery under test. The sensor may apply the signal to the battery under test concurrently with generating the test signal. For example, the sensors may drive a controllable switch with the test signal. The switch when closed may drive a test current across the battery under test.

The battery may alter the test signal, producing a response signal. The response signal may be a version of the test signal altered due to the RC characteristics of the battery. The battery, owing to its behavior as an RC equivalent circuit, may provide a preliminary low-pass filtering function that attenuates some of the high frequencies of the pulse width modulated test signal. The resultant response signal may reveal a desired low frequency sinusoidal frequency component. The response signal may be further filtered by the sensor.

At 908, the response signal of the battery as excited by the pulse width modulated test signal may be measured. The response signal may be sampled in accordance with the generating of the test signal. For example, the response signal may be sampled via correlating synchronous sampling detection process. The response signal may be measured by sampling at each peak and valley of the response signal by the microcontroller based on the data that the microcontroller used to generate the test signal.

Correlated detection measurement may, in effect, produce a frequency selective, bandpass filtered, detection function on the amplified signal. This detection function may result in the detection of the desired signal's amplitude while rejecting the high-frequencies generated by the sensor's PWM and other noise sources in the battery plant system. As more measurements are averaged the detection process may become more selective and the measurement time may increase.

From the measurements, the microcontroller may determine the RC characteristics of the battery. For example, the microcontroller may determine the admittance of the battery. The microcontroller may measure the resultant amplitude to determine the RC characteristics of the battery including the admittance. The admittance may be used as an indication of the health of the battery.

At 910, it may be determined that the battery is overcharged. If it is determined that the battery is overcharged, current may be drawn from the battery to correct the overcharged state. For example, the microcontroller may be used to draw current from the battery. In an embodiment, current may be drawn from a battery selected from a string of batteries.

The sensor may equalize the charge of an individual battery within a monitored string of batteries. The sensor may measure the DC terminal voltage of the battery. The sensor and/or sensors may perform a variable charge equalization of the individual batteries in the string, by impressing a variable current load on the battery, which may remove charge from the battery.

The central site control unit may monitor the terminal voltages of each battery in each string. The site controller can determine which batteries might be overcharged and which batteries might be undercharged. The site controller may send commands to the sensors on the overcharged batteries instructing them to generate a continuous programmed test current on the battery until the excess charge is removed. In this manner, battery life may be extended because overcharging, a leading cause of battery failure, may be mitigated.

What is claimed:

1. A battery sensor for testing a battery comprising:
   (a) a microcontroller configured to: (i) analyze frequencies of background noise at a battery to be tested during a test operation; (ii) determine, based on an analysis of the background noise, a duty cycle of a desired pulse width modulation (PWM) signal to be applied to the battery, the duty cycle being selected such that, when applied to the battery, it at least approximates an AC signal having a frequency that has been determined by the microcontroller to provide optimal test results in view of the background noise; (iii) generate the desired PWM signal; (iv) analyze a response from the battery resulting from application of the PWM signal thereto; and (v) based on the response, determine at least one attribute of the battery; and,
   (b) circuitry, including a switch, for applying the PWM signal to the battery.

2. The battery sensor of claim 1 wherein the microcontroller is configured to perform (i) through (v) for different test operations.

3. The battery sensor of claim 1 wherein the microcontroller is configured to perform (i) through (v) on demand in response to a remotely generated command.

4. The battery sensor of claim 1 wherein the attribute comprises one or more of internal admittance, voltage, current, and temperature.

5. The battery sensor of claim 1 further comprising a communications interface adapted to communicate with a controller.

6. The battery sensor of claim 1 wherein the microcontroller is further configured to determine whether the battery under test is overcharged, and, in response, to cause the switch to draw current from the battery under test.

7. The battery sensor of claim 1 wherein the switch is a FET.

8. The system of claim 1 wherein the sensor is adapted to be attached to the exterior of, and to a terminal of, the battery under test.

9. A battery testing system comprising:
   (a) a plurality of battery sensors, each sensor adapted to be associated with one of a plurality of batteries to be tested, each sensor comprising:
      (i) a microcontroller configured to: (1) analyze frequencies of background noise at a battery to be tested during a test operation; (2) determine, based on an analysis of the background noise, a duty cycle of a desired pulse width modulation (PWM) signal to be applied to the battery, the duty cycle being selected such that, when applied to the battery, it at least approximates an AC signal having a frequency that has been determined by the microcontroller to provide optimal test results in view of the background noise; (3) generate the desired PWM signal; (4) analyze a response from the battery resulting from application of the PWM signal thereto; and, (5) based on the response, determine at least one attribute of the battery; and,
      (ii) circuitry, including a switch, for applying the PWM signal to the battery; and,
      (iii) a communications interface;
   (b) a controller adapted to communicate with (i) the sensors via each sensor's communications interface and (ii) a remote management server.

10. The system of claim 9 wherein the microcontroller of each sensor is configured to dynamically alter the duty cycle of the PWM signals by analyzing the frequency spectrum of the background noise at its respective battery under test.

11. The system of claim 9 wherein the attribute comprises one or more of internal admittance, voltage, current, and temperature.

12. The system of claim 9 wherein the microcontroller of each sensor is configured to periodically determine the attribute and the microcontroller is configured to communicate the attribute to the controller.

13. The system of claim 9 wherein controller is configured to periodically poll each sensor to so as to communicate the attribute that each sensor determined to the controller.

14. The system of claim 9 wherein the controller is configured to send a command to each sensor to initiate a test operation.

15. The system of claim 9 wherein the controller is configured to provide an indication of battery condition based on the attribute.

16. The system of claim 9 wherein the controller is configured to communicate the indication to the remote management server.

17. The system of claim 9 wherein the microcontroller is further configured to determine whether the battery under test is overcharged, and, in response, to cause the switch to draw current from the battery under test.

18. The battery sensor of claim 9 wherein the switch is a FET.

19. The system of claim 9 wherein the sensors are adapted to be attached to the exterior of, and to a terminal of, each respective battery under test.

20. A battery testing method comprising:
a) analyzing frequencies of background noise at a battery under test;
b) determining, based on an analysis of the background noise, a duty cycle of a pulse width modulation (PWM) signal to be applied to the battery, the duty cycle being selected such that, when applied to the battery, it at least approximates an AC signal having a frequency that has been determined by the microcontroller to provide optimal test results in view of the background noise;
c) generating the PWM signal, and applying the PWM signal to the battery under test;
d) analyzing a response from the battery resulting from application of the PWM signal thereto; and,
e) based on the response, determining at least one attribute of the battery.

21. The method of claim 20 further comprising dynamically altering the duty cycle of the PWM signals by analyzing the frequency spectrum of the background noise at the battery under test.

22. The method of claim 20 wherein the attribute comprises one or more of internal admittance, voltage, current, and temperature.

23. The method of claim 20 further comprising providing an indication of battery condition based on the attribute, and communicating the indication to a remote management server.

24. The method according to claim 20 further comprising determining whether the battery under test is overcharged, and in response, causing the battery under test to discharge through a switch.

* * * * *